March 1, 1966 W. W. PENDLETON ETAL 3,238,025
HIGH-TEMPERATURE CONDUCTOR
Filed Dec. 31, 1962
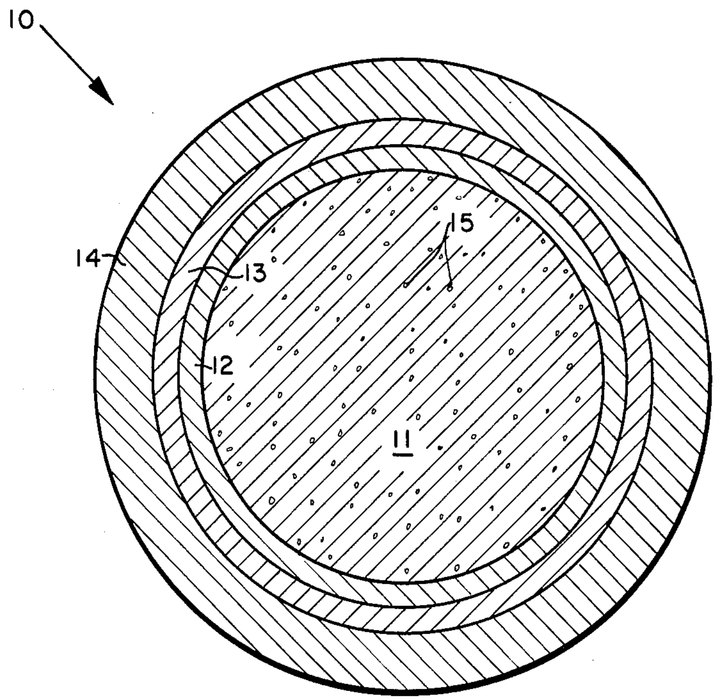
INVENTORS
WESLEY W. PENDLETON
HARRY L. SAUMS
RICHARD D. CORNELL
V. F. Volk
THEIR AGENT

United States Patent Office 3,238,025
Patented Mar. 1, 1966

3,238,025

HIGH-TEMPERATURE CONDUCTOR

Wesley W. Pendleton, Muskegon, Harry L. Saums, North Muskegon, and Richard D. Cornell, Muskegon, Mich., assignors, by mesne assignments, to Anaconda Wire and Cable Company, a corporation of Delaware Filed Dec. 31, 1962, Ser. No. 248,328
19 Claims. (Cl. 29—194)

Our invention relates to electrical conductors suitable for service at temperatures of 650° C. and over and particularly to said conductors having copper cores protected by oxidation-resistant sheaths and barrier layers of refractory metal.

In the manufacture of electrical conductors of high conductivity for service at very high temperatures such as 650° C. and even 850° C., where copper is used as the main current-carrying element, it is essential to protect it from the oxidation that occurs very rapidly at such high temperatures. Efforts to accomplish this protection by covering the copper with a sheath of alloy known to be oxidation-resistant at high temperatures have been self-defeating because of diffusion of elements inwardly into the copper which severely reduces the electrical conductivity. We have discovered that this diffusion can be prevented by a barrier layer of a refractory metal chosen from groups IV–*a*, V–*a* and VI–*a* of the periodic table of the elements. Of these metals we prefer tantalum and niobium as our barrier layer for reasons hereinafter to be explained.

We have found that although copper wires made with our barrier layer are serviceable at temperatures of about 750° C., if they are aged for long periods the oxidation-resistant sheath may fail. The reasons for this failure are not fully understood but we have further discovered that if a layer of pure copper is interposed between the barrier layer and the sheath these failures of the sheath are prevented with the result that the wires will retain high conductivity when held for periods in excess of 1000 hours at temperatures greater than 800° C. in air.

We have discovered that when copper wire is maintained at temperatures in excess of 750° C. for long periods of time there is an unexpected roughening of the wire surface sufficient to cause cracking of inorganic insulation coatings and even the oxidation-resistant sheaths. We have further discovered that this surface roughening can be prevented by dispersing a small proportion of refractory particles, of which aluminum oxide is an example, throughout the copper structure. Copper with from 0.1–2%, by volume, of aluminum oxide is suitable, although we prefer the dispersion of about 0.5% by volume of the oxide. We shall use the words "dispersion-treated copper" in this application for copper that has been protected from roughening in this manner.

Our electrical conductor for high-temperature service comprises a copper or dispersion-treated copper core, a metal barrier layer selected from the groups IV–*a*, V–*a* and VI–*a* of the periodic table of the elements, and preferably tantalum or niobium, surrounding the core, and a high-temperature-oxygen-resistant metallic sheath surrounding the barrier layer.

Particularly, our electrical conductor suitable for service at 800° C. comprises a copper or dispersion-treated copper core, a metal barrier layer selected from the groups IV–*a*, V–*a*, and VI–*a* of the periodic table of the elements, and preferably tantalum or niobium, surrounding the core, a bonding layer of pure copper surrounding the barrier layer, and an oxidation-resistant metallic sheath surrounding the bonding layer. In preferred embodiments of our invention the outer sheath is an alloy comprised of about 76% nickel, about 16% chromium, and about 8% iron.

A more thorough understanding of our invention may be gained from a study of the appended drawing and the following discussion.

In the drawing the figure is a section of a conductor of our invention.

In the drawing a composite conductor indicated generally by the numeral 10 has a central conductor core 11 of pure copper, free from oxygen and sulfur, in which there are dispersed a plurality of particles 15 of aluminum oxide. We find it necessary to use such dispersion-treated copper for service above 750° C. because it prevents the roughening of the surface which we have discovered would otherwise occur at this temperature with consequent fracture of the sheath and insulation. For less severe service, however, our conductor does have usefulness with copper cores without dispersion treatment and we do not wish to limit our invention to this particular preferred embodiment. Various means have been suggested for forming dispersion-strengthened copper, such as oxidizing the aluminum in a copper aluminum alloy, but we have found a satisfactory method to be that of adding about 0.5% by volume of alumina powder of about 0.03 micron size to a copper powder of about 1.4 micron size, mixing thoroughly, reducing in hydrogen at 500° F., compressing at 30,000 p.s.i., sintering at 1472° F. and hot extruding to form rod.

Over the conductor 11 we apply a barrier layer 12 of tantalum or niobium. Other refractory metals from groups IV–*a*, V–*a*, and VI–*a* may also be used for preventing migration of nickel or other elements into the conductor 11. For instance we found titanium to be suitable for use as our barrier layer 12 for relatively low temperatures but it forms a low-melting alloy with copper at 900° C. Chromium, which is otherwise satisfactory, lacks sufficient ductility for any process that requires a subsequent draw-down.

A layer 13 of pure copper, applied over the barrier layer 12, is a novel element of our invention. Since the barrier metals have very high affinity for oxygen it is essential that no oxygen should be available from the copper 13. We have found that OF copper and phosphorus-bearing copper such as DLP (deoxidized low phosphor) copper are satisfactory, as is copper applied by electroplating. The expression "pure copper," as used in this application, will be understood to include the above three types but is not necessarily limited thereto. Over the layer 13 of copper there is a sheath 14 of metal which is oxidation-resistant at the high temperature for which the conductor is intended, and which may have a substantial proportion of nickel. Particularly suitable is the nickel alloy containing about 76% nickel, 16% chromium, and 8% iron known by the trademark Inconel and sold by The International Nickel Co., Inc., of New York, N.Y. Nickel, and also stainless steel, including nickel-free stainless, has been found suitable where the service temperature of the wire in air does not substantially exceed 650° C. We have discovered that, in the absence of our copper layer 13, the sheath 14 will crack after long exposures at temperatures of the order of 850° C. This cracking, which has the effect of exposing the underlying core of oxidation, is prevented by the interposition of the layer of copper 13.

In the manufacture of our conductor a rod of the core copper 11 is assembled within concentric tubes of the metals forming the layers 12, 13, 14; swaged down to seat the metals together, and annealed. Thereafter the assembly is drawn down to sizes as fine as A.W.G. No. 30 by standard wire drawing methods. In making up the composite conductor of our invention we have found that the wall thickness of the various components should be such that the area of the cross-section is 50–70% copper core, 3–7% barrier layer, 4–10% copper bonding layer, and 20–35% oxidation-resistant sheath; with an optimum value of 66% core, 6% barrier, 5% bond, and 23% sheath. These ratios provide a maximum conductivity of the conductor after prolonged operation at high temperatures while providing sufficient thickness for the outer layers to draw down properly and to protect the core.

When copper conductors were sheathed with high-temperature oxidation-resistant metals such as stainless steel, nickel, and Inconel, the conductivity of the copper was found to drop rapidly upon exposure to temperatures of 850° C., although we knew these metals to be satisfactory as sheaths for copper at temperatures as high as 500° C. Microscopic examination indicated that the conductivity loss was due to a radial penetration of ions into the copper surface. Where nickel was present in the sheath a low-conductivity nickel-copper alloy was formed, and in the case of nickel-free stainless steel the copper appeared to be penetrated by iron. When, however, a layer of tantalum or niobium metal was interposed between the copper and the sheath, loss of conductivity, due to penetration of ions of whatever nature, was entirely prevented. The high loss of conductivity of sheathed conductors in the absence of a barrier layer is shown in Table I.

TABLE I

| Sheath Material | Hours at 850° C. | Room Temperature Conductivity, Percent IACS [1] |
|---|---|---|
| Nickel | 0 | 78.4 |
| Do | 25 | 66.5 |
| Do | 90 | 55.7 |
| Do | 170 | 54.0 |
| Stainless steel (nickel-free) | 0 | 72.0 |
| Do | 65 | 50.9 |
| Do | 110 | 45.4 |
| Do | 340 | 33.9 |
| Inconel | 0 | 78.4 |
| Do | 24 | 72.0 |
| Do | 80 | 58.4 |
| Do | 165 | 50.9 |
| Do | 260 | 46.0 |

[1] IACS is an abbreviation of International Annealed Copper Standard.

When tantalum or niobium barrier layers were inserted between the sheath and the copper cores, the loss of conductivity upon aging at 850° C. was relatively much less. This is shown in Table II.

TABLE II

| Sheath Material | Barrier | Hours at 850° C. | Atmosphere | Room Temperature Conductivity, percent IACS | |
|---|---|---|---|---|---|
| | | | | Initial | Final |
| Inconel | Ta | 1,158 | Argon | 69.4 | 66.6 |
| Do | Nb | 465 | do | 60.0 | [1] 48.7 |
| Do | Nb | 465 | Air | 59.8 | [1] 51.1 |

[1] These conductors had a heavy copper bonding layer over the niobium and the loss of conductivity in this layer accounts for the bulk of the conductivity loss. The copper core under the barrier was practically unaffected.

*Example I*

A No. 18 A.W.G. composite conductor was drawn to have the following section:

| | Area percent |
|---|---|
| Dispersion-treated pure copper | 50 |
| Niobium barrier layer | 5 |
| DLP copper bonding layer | 10 |
| Inconel sheath | 35 |

The conductor of Example I was aged in air at 850° C. and the conductivity measured at room temperature at the intervals stated in Table III.

TABLE III

| Aging time, hrs.: | Conductivity, Percent IACS |
|---|---|
| 0 | 59.8 |
| 147 | 51.6 |
| 303 | [1] 45.0 |
| 465 | 51.1 |

[1] It is suspected that this value was depressed by a high contact resistance in the measuring circuit.

*Example II*

A composite conductor comprised of a copper core, a tantalum barrier layer, and a nickel sheath, but no bonding layer, was drawn down to size 11 A.W.G. and aged for 522 hours at 850° C. Severe craters and cracks developed in the sheath.

*Example III*

A composite conductor comprised of a copper core, a tantalum barrier layer, and an Inconel sheath, but no bonding layer, was drawn down to 18 A.W.G. and aged for 1158 hours at 850° C. The Inconel sheath ruptured on bending.

*Example IV*

A composite conductor comprised of a copper core, a tantalum barrier layer, an oxygen-free-copper bonding layer and an Inconel sheath was drawn down to No. 18 A.W.G. and aged for 1035 hours at 850° C. No rupture of the sheath occurred even upon bending the aged conductor.

Comparison of Example IV, wherein the composite conductor had a bonding layer between the nickel and tantalum, with Examples II and III, in which the bonding layer was lacking, shows the utility of our invention.

*Example V*

Specimens of commercial oxygen-free, high-conductivity copper and of dispersion-treated copper were drawn down to No. 18 and No. 20 A.W.G. and aged in argon (to prevent oxidation) for 1023 hours. At the end of this period the surfaces of the dispersion-treated wires were still smooth and unbroken but the commercial copper wires were rough to the touch and the surfaces were visibly broken to an extent that would preclude any attempt to apply an insulating coating. The roughening of the surfaces also had the effect of reducing the physical properties of the wires as evidenced by Table IV.

TABLE IV

| | Size, A.W.G. | Properties after aging | |
|---|---|---|---|
| | | Percent Elongation | Tensile Strength, p.s.i. |
| Commercial copper | 20 | 9.0 | 19,300 |
| | 18 | 12.5 | 21,800 |
| Dispersion-treated copper | 20 | 15.75 | 24,200 |
| | 18 | 20.75 | 23,400 |

We have invented a new and useful electrical conductor for which we desire an award of Letters Patent.

We claim:

1. A composite electrical conductor suitable for high-temperature service comprising:

A. a copper core,

B. a metal barrier layer surrounding said core selected from the group consisting of niobium, tantalum, and titanium, and C. a high - temperature oxidation - resistant metallic sheath selected from the group consisting of nickel and nickel alloys surrounding said barrier layer.

2. The composite conductor of claim 1 wherein said barrier layer is tantalum.

3. The composite conductor of claim 1 wherein said barrier layer is niobium.

4. A composite electrical conductor suitable for high-temperature service comprising:
A. a copper core,
B. a barrier layer surrounding said core selected from the group consisting of niobium, tantalum, and titanium,
C. a copper bonding layer surrounding said barrier layer, and
D. a high-temperature oxidation-resistant metallic sheath selected from the group consisting of nickel and nickel alloys surrounding said bonding layer.

5. The composite conductor of claim 4 wherein said barrier layer is tantalum.

6. The composite conductor of claim 4 wherein said barrier layer is niobium.

7. A composite electrical conductor suitable for service at 800° C. comprising:
A. a copper core,
B. a barrier layer surrounding said core selected from the group consisting of niobium, tantalum, and titanium,
C. a bonding layer of copper surrounding said barrier layer, and
D. an oxidation-resistant alloy sheath surrounding said bond layer,
(a) comprising, by weight, about 76% nickel, about 16% chromium, and about 8% iron.

8. The composite conductor of claim 7 wherein said barrier layer is tantalum.

9. The composite conductor of claim 7 wherein said barrier layer is niobium.

10. A composite electrical conductor suitable for service at 800° C. comprising:
A. a dispersion-treated copper core comprising refractory oxide particles dispersed in the copper and thereby retarding copper crystal growth,
B. a barrier layer surrounding said core selected from the group consisting of niobium, tantalum, and titanium,
C. a bonding layer of copper surrounding said barrier layer, and
D. an oxidation-resistant metallic sheath surrounding said bonding layer.

11. The composite conductor of claim 10 wherein said barrier layer is tantalum.

12. The composite conductor of claim 10 wherein said barrier layer is niobium.

13. A composite electrical conductor suitable for service at 800° C. comprising:
A. a dispersion-treated copper core comprising refractory oxide particles dispersed in the copper and thereby retarding copper crystal growth,
B. a barrier layer surrounding said core selected from the group consisting of niobium, tantalum, and titanium,
C. a copper bonding layer surrounding said barrier layer, and
D. an oxygen-resistant alloy sheath surrounding said bonding layer,
(a) comprising, by weight, about 76% nickel, about 16% chromium, and about 8% iron.

14. The composite conductor of claim 13 wherein said barrier layer is tantalum.

15. The composite conductor of claim 13 wherein said barrier layer is niobium.

16. A composite electrical conductor suitable for high-temperature service comprising:
A. a copper core,
(a) having a cross-sectional area of 50–70% of the total cross-sectional area of said conductor,
B. a barrier layer surrounding said core,
(a) selected from the group consisting of niobium, tantalum, and titanium, and
(b) having a cross-sectional area of 3–7% of the total cross-sectional area of said conductor,
C. a copper bonding layer surrounding said barrier layer,
(a) having a cross-sectional area of 4–10% of the cross-sectional area of said conductor, and
D. an oxidation-resistant metallic sheath selected from the group consisting of nickel and nickel alloys surrounding said bonding layer,
(a) said sheath having a cross-sectional area of 20–35% of the cross-sectional area of said conductor.

17. A composite electrical conductor suitable for high-temperature service comprising:
A. a copper core,
(a) having a cross-sectional area of approximately 66% of the cross-sectional area of said conductor,
B. a barrier layer surrounding said core,
(a) selected from the group consisting of niobium, tantalum, and titanium, and
(b) having a cross-sectional area of approximately 6% of the cross-sectional area of said conductor,
C. a copper bonding layer surrounding said barrier layer,
(a) having a cross-sectional area approximately 5% of the cross-sectional area of said conductor, and
D. an oxidation-resistant metallic sheath selected from the group consisting of nickel and nickel alloys surrounding said bonding layer,
(a) said sheath having a cross-sectional area of approximately 23% of the cross-sectional area of said conductor.

18. The conductor of claim 16 wherein said core is dispersion-treated copper.

19. The conductor of claim 17 wherein said core is dispersion-treated copper.

References Cited by the Examiner

UNITED STATES PATENTS

| | | | |
|---|---|---|---|
| 1,527,177 | 2/1925 | Elmen | 29—195 |
| 1,637,033 | 7/1927 | Basch | 29—195 |
| 2,387,903 | 10/1945 | Hensel | 29—198 |
| 2,816,066 | 12/1957 | Russell | 29—198 |
| 2,871,550 | 2/1959 | Weinberg | 29—194 |

DAVID L. RECK, *Primary Examiner.*

HYLAND BIZOT, *Examiner.*

UNITED STATES PATENT OFFICE
CERTIFICATE OF CORRECTION

Patent No. 3,238,025 March 1, 1966

Wesley W. Pendleton et al.

It is hereby certified that error appears in the above numbered patent requiring correction and that the said Letters Patent should read as corrected below.

Column 2, line 60, for "of", first occurrence, read -- to --; column 5, line 25, for "bond" read -- bonding --.

Signed and sealed this 24th day of January 1967.

(SEAL)
Attest:

ERNEST W. SWIDER
Attesting Officer

EDWARD J. BRENNER
Commissioner of Patents